United States Patent [19]

Peltola et al.

[11] 4,045,658

[45] Aug. 30, 1977

[54] DIGITIZED LINEARIZING CORRECTION APPARATUS WITH FREQUENCY MODULATION

[75] Inventors: Veikko K. Peltola; James M. Duros, both of Chicago, Ill.

[73] Assignee: Alnor Instrument Co., Niles, Ill.

[21] Appl. No.: 648,463

[22] Filed: Jan. 12, 1976

[51] Int. Cl.² ............................................. H03B 3/04
[52] U.S. Cl. ................................. 235/151.3; 328/140
[58] Field of Search ................. 235/151.34, 92, 92 T, 235/92 TF, 92 F, 92 MT, 92 FL; 328/140; 307/308, 310, 1, 2; 73/1 F

[56] References Cited

U.S. PATENT DOCUMENTS

| | | | |
|---|---|---|---|
| 3,550,019 | 12/1970 | Thomas | 328/140 |
| 3,566,685 | 3/1971 | Zimmerman et al. | 235/151.34 X |
| 3,700,865 | 10/1972 | Ley | 235/151.34 X |
| 3,739,636 | 6/1973 | Versaci et al. | 235/151.34 X |
| 3,822,377 | 7/1974 | Beck | 235/151.34 |
| 3,854,038 | 12/1974 | McKinley | 235/151.34 |
| 3,895,377 | 7/1975 | Schwalenstocker | 235/151.34 X |
| 3,905,229 | 9/1975 | Togo et al. | 235/151.34 X |

Primary Examiner—Edward J. Wise
Attorney, Agent, or Firm—Silverman & Cass, Ltd.

[57] ABSTRACT

A digitized linearizing correction apparatus has an input from a nonlinear responding thermocouple which produces a signal proportional to a temperature to be measured. An oscillator generates clock pulses at a first frequency which are fed to a counter and also are fed to a timing generator for alternately producing sample timing and count timing signals. A passive integrator receives the proportional signal during the sample timing signal and is discharged proportional thereto. A constant current source is coupled to the integrator during the count timing signal for charging the integrator at a constant rate. A comparator is coupled to the output of the integrator and also to a fixed referenced level for producing an output signal when the integrator is charged back to the reference level. The time from the start of the count timing signal until the integrator output signal is produced establishes a counting period. To accomplish linearizing, the timing generator causes the oscillator to change to a second frequency upon the attainment of a first predetermined number of clock pulses during the count timing signal. Similarly, upon the attainment of a second predetermined number of clock pluses during the count timing signal, the oscillator is caused to operate at a third frequency. Accordingly, the counting period is segmented into parts having respectively different frequency modulation to provide the desired linearization. The accumulated frequency modulated count of the clock pulses during the counting period is obtained for transfer to a display device as a reading of the measured temperature.

12 Claims, 6 Drawing Figures

DIGITIZED LINEARIZING CORRECTION APPARATUS WITH FREQUENCY MODULATION

BACKGROUND OF THE INVENTION

This invention concerns a digitized linearizing correction apparatus for an analog measuring instrument, and more particularly, a digitized linearizing apparatus utilizing frequency modulation to linearize the nonlinear input.

The nonlinear analog output response of thermocouples, and for that matter other types of transducers, long has been recognized. As technology progressed, the need for greater measurement accuracy proportionately increased, such that at the present time the error caused by the nonlinear output response of transducers has become significant. Often, because of the nature of an input transducer, errors are progressive over a known range and, with a linear indicator, a tolerable degree of error at the low end of the range soon changes to an unacceptable quantum of error by midrange and thereabove. Often the error is monotonic in nature, as is known in thermocouples.

Such nonlinearity has been dealt with previously by the use of various means including compensating meter movements which are designed to posses an equal, yet opposite nonlinear response characteristic. However, a meter a limited in its linear accuracy, especially when the linear approximation changes from one part or section of a response to the next. Nonlinear electronic elements, such as diodes and potentiometers and also servo-mechanisms of varying complexity and cost have been employed for linearization. Linearization often has been accomplished in an analog method; however, this results in apparatuses which are typically costly, occupy a relatively large amount of space, are slow to react and are subject to the inertia disadvantage of overshoot.

Most, if not all, of these deficiencies can be overcome by analog to digital conversion and digitized linearization of the error by providing discrete amounts of correction for application progressively, when needed. One system utilizing digitized linearizing correction is shown in U.S. Pat. No. 3,793,630 owned by the Assignee of the instant application. The system feeds a continuous train of clock pulses into counters and excludes certain of the clock pulses over the various ranges of the system such that the monotonic error progression is suppressed. This is an especially accurate method which can be used where mobility is not of a great deal of concern. However, the circuit required to produce this accuracy is too complex, too large and too expensive to be applied in a portable measuring system or instrument. This is especially true in producing a hand held instrument which must be packaged in a very small and lightweight package. To produce a linearizer for a hand held instrument, some accuracy can be sacrificed to provide an apparatus with fewer and less complex elements. This results in the required lightweight and smaller size apparatus and also a less expensive apparatus.

SUMMARY OF THE INVENTION

In practicing a preferred embodiment of the invention, digitized linearization is accomplished by generating and counting clock pulses during a counting period which is proportional in time to the magnitude of a nonlinear input signal. A clock oscillator generates the clock pulses at a first frequency at the start of each counting period. A timing generator causes the clock oscillator to change frequency at least at a first predetermined number of clock pulses counted to effect a linearization of the number of clock pulses counted during the counting period. The timing generator also generates two alternating timing signals to synchronize the digitized linearization. A sample timing signal causes an integrator to discharge from a reference level proportional to the input signal and a count timing signal causes the start of the counting period and causes the integrator to charge back up at a constant rate. A comparator generates a signal to end the counting period when the integrator has charged back to the reference level. The count of frequency modulated clock pulses obtained during the counting period is the digitized linearized count indicative of the magnitude of the input signal. The timing generator can cause the count to be obtained after a predetermined number of counting periods.

DESCRIPTION OF THE PREFERRED EMBODIMENT

Figure 1:
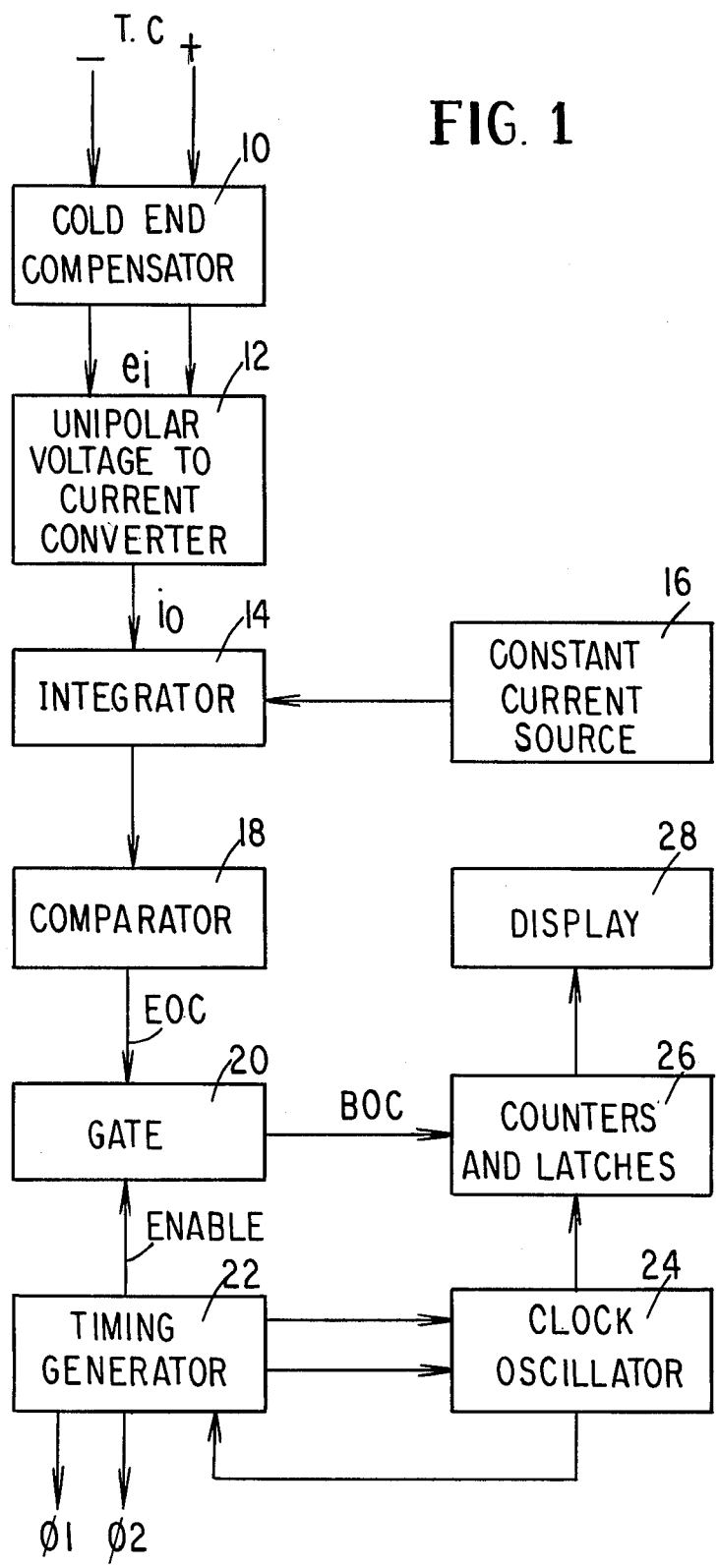
FIG. 1 is a block diagram of a preferred embodiment of the invention.

Referring to FIG. 1, a cold end compensator 10 is shown connected to a thermocouple (TC) output. Cold end compensators are well known in the art and they function to adjust the output level of the thermocouples for changes in temperature at the junction of the alloy and copper wire. As ambient temperature falls, the compensator will add a small voltage to the TC output and as ambient temperature rises, a small voltage will be subtracted from the TC output. This compensated output $e_i$ is input to a voltage to current converter 12 which is typically a unipolar converter operating for only one polarity of voltage. Although the apparatus is being described utilizing a voltage input from a thermocouple, the input could be other than a voltage input signal and could be any type of nonlinear analog signal, not just one from a thermocouple. A current $i_o$ is output from the converter 12 to an integrator 14 which is preferably a passive type integrator. The integrator 14 will charge or discharge in response to the input current $i_o$ and will be discharged or charged by a signal source 16. Although the current $i_o$ could be of either polarity, for ease of understanding it hereafter will be discussed as discharging the integrator and the signal source 16 as charging the integrator. In this case utilizing a current input signal, the signal source 16 will be a constant current source.

A comparator 18 compares the integrator charge (or level) with a fixed reference level. The comparator 18 generates a low or negative "end of count" output signal EOC which is coupled to a gate 20 when the integrator has been charged back to the reference level, which designates the end of a counting period. The gate 20 has as a second input a high or positive ENABLE signal from a timing generator 22. The timing generator 22 generates two alternating timing signals $\phi 1$ and $\phi 2$ (count timing and sample timing respectively) which are utilized to switch the integrator inputs between the input signal $i_o$ and the constant current source 16 to synchronize the operation of the apparatus. Unless otherwise noted, all further references to the timing signals $\phi 1$ and $\phi 2$ will refer to their positive or high portion.

A clock oscillator 24 is provided to generate clock pulses at a suitable frequency which are counted both by the timing generator and a counters and latches device 26. After a first and second predetermined number of pulses from the clock oscillator, the timing generator will cause the clock oscillator to change (modulate) frequency.

The modulation of the clock oscillator frequency linearizes the number of clock pulses generated in a particular time period. The number of the modulations and magnitude of the modulations are chosen to provide the desired linearization for a particular range of input signals. Also, after a predetermined number of the alternating timing signals, the timing generator will generate the high signal ENABLE coupled to the gate 20. When the signal ENABLE is high and the signal EOC is high at gate 20, gate 20 will produce a negative or low output signal BOC which is coupled to the counters and latches. At the beginning of the signal BOC the counters in the device 26 start counting from a zero count which is transferred to the latches in the device 26. When the negative signal EOC is generated and coupled to the gate 20, the signal BOC will go high and the transfer of the count will be completed. The count in the latches then can be displayed in a display device 28.

Figure 2:
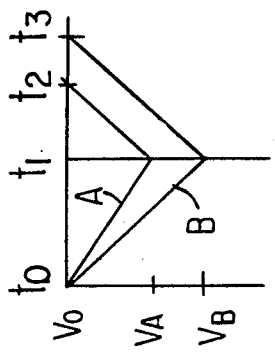
FIG. 2 is a dual slope voltage chart.

Referring now to FIG. 2, the dual slope voltage chart will be explained to illustrate converting the input signal into a time referenced signal. A fixed period of time exists between times $t_o$ and $t_1$ corresponding to the timing signal $\phi 2$. Assuming an input signal $e_i$ equal to an input signal "A" (here a temperature) the integrator 14 will integrate a ramp signal indicated at "A" commencing at time $t_o$ at the integrator reference voltage or reference level $V_o$. This ramp will be terminated at time $t_1$ with the integrator charge at a charge level $V_A$. As previously mentioned, this timed interval between time $t_o$ and $t_1$ is fixed and occurs repetitively. At time $t_1$ the timing generator generates the timing signal $\phi 1$ to cause the integrator to receive the current from the constant current source to charge the integrator from the charge level $V_A$ back to the reference voltage $V_o$. The constant current source will produce a constant ascending charge level which will terminate at time $t_2$. The charge level of the integrator 14 will be detected by the comparator 18 when the charge level reaches the reference voltage $V_o$ at time $t_2$.

If a time $t_o$ the thermocouple was reporting an input signal $e_i$ equal to a temperature "B" which was greater than the temperature "A", then a more acute descending ramp "B" will be formed, which will also terminate at time $t_1$, but at a lower or more negative charge level $V_B$. Again, at time $t_1$ the constant current source will supply current to the integrator and the constant ascending charge level again will be sensed at time $t_2$ by the comparator 18 when the charge level reaches the reference voltage $V_o$. The time from $t_1$ to $t_3$ will be greater than the time from $t_1$ to $t_2$, because it will take a longer period of time for the constant current source to charge the integrator from the charge level $V_B$ to the reference voltage $V_o$ than it did to change the integrator from the more positive charge level $V_A$ to $V_o$. It now will be appreciated that the input signals or temperatures are proportional to the duration of the constant ascending ramp voltages, and that such duration may be subdivided by clock pulses into a digitized representation of the input signal.

The digitized representation (or count) is linearized by the apparatus by modulating the clock pulse frequency, such that each clock pulse latched into the latches of the device 26 with the signal BOC, before the transfer of the pulses is terminated by the signal EOC at the reference voltage $V_o$ (time $t_2$ or $t_3$), represents one unit of the input signal. In this case, using a thermocouple output, the count in the latches can represent one degree of temperature of one clock pulse (or count) latched, which can be displayed in the display 28.

Figure 3:
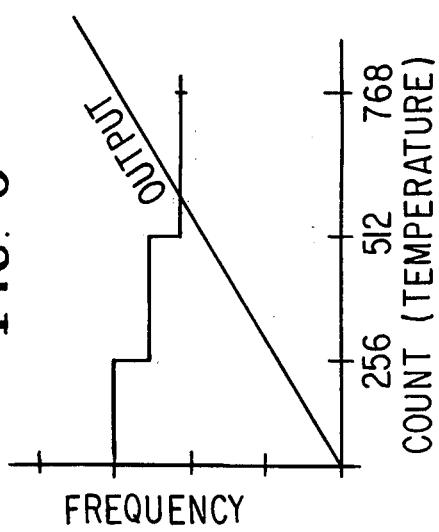
FIG. 3 is a frequency versus count chart.

Referring now to FIG. 3, the change or modulation in frequency as the clock pulses are generated during the timing signal $\phi 1$ can be seen. The oscillator frequency is shown as being changed (decreased) at two points, but of course it could be changed at a greater or lesser number of points depending on the temperature or input range and accuracy desired. In this case the points have been picked at a count of two hundred and fifty-six and a count of five hundred and twelve. After reaching the first count of two hundred and fifty-six, the timing generator 22 will cause a decrease in the oscillator frequency by a predetermined amount. Upon reaching the second count of five hundred and twelve the timing generator will cause a further decrease in the oscillator frequency. Thus the time to count from zero to two hundred and fifty-six will be less than the time to count from two hundred and fifty-seven to five hundred and twelve, which will be less than the time to count from five hundred and thirteen to seven hundred and sixty-eight. Thus it can be seen that two linearizing amounts of correction have been added to the output count when the input signal causes an output count greater than a count of five hundred and twelve.

Figure 4:
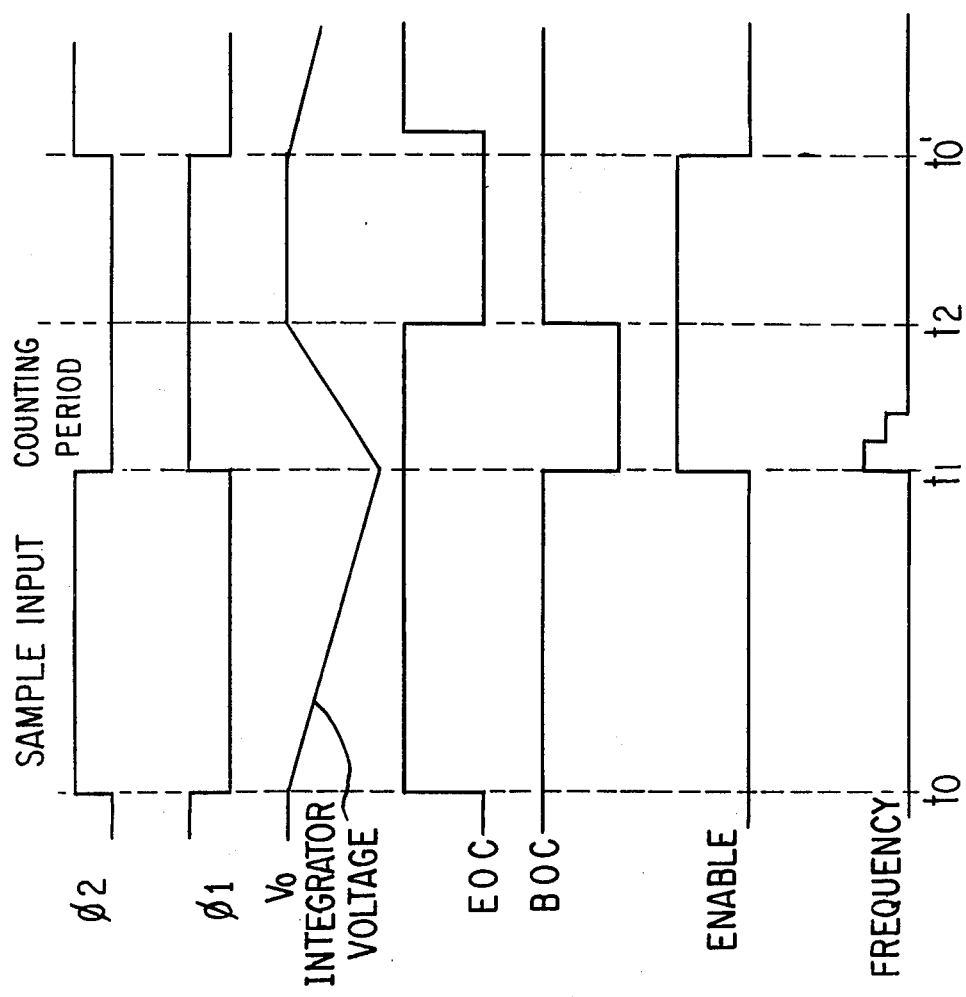
FIG. 4 is a timing chart for use in conjunction with FIGS. 1, 5 and 6.

FIG. 4 shows the timing cycles utilized in the apparatus which have been described in the overall apparatus operation and whose generation will be discussed with the circuit details of FIGS. 5 and 6. The integrator 14 will discharge from the reference level during each timing signal $\phi 2$ (time $t_o$ to time $t_1$) as shown by the integrator voltage waveform. During each signal $\phi 2$, the signals $\phi 1$ and ENABLE are negative or low, the signal BOC is high or positive, and the state of signal EOC is irrelevant. At the end of each signal $\phi 2$, the signal $\phi 1$ (time $t_1$ to time $t_o'$) goes positive or high and the integrator will charge until the reference voltage is reached. Although the signal ENABLE could be chosen to go positive or high on each signal $\phi 1$, it is convenient to allow the signal ENABLE to go positive only following a predetermined number of the signals $\phi 2$. Each time that the signal ENABLE goes positive or high, then the signal BOC will go negative or low. When the integrator charges back to the reference level (time $t_2$), the signal EOC will go negative or low. At this time the signal BOC goes positive and an auto-zero time period is initialized. The signal EOC will go negative during each signal $\phi 1$. At the start of the next signal $\phi 2$ the cycle will be repeated (time $t_o'$). The bottom waveform is an oscillator frequency versus time waveform coordinating FIGS. 2 and 3 with FIG. 4 with the times $t_o$, $t_1$, and $t_2$ corresponding to the same times in FIG. 2.

Figure 5:
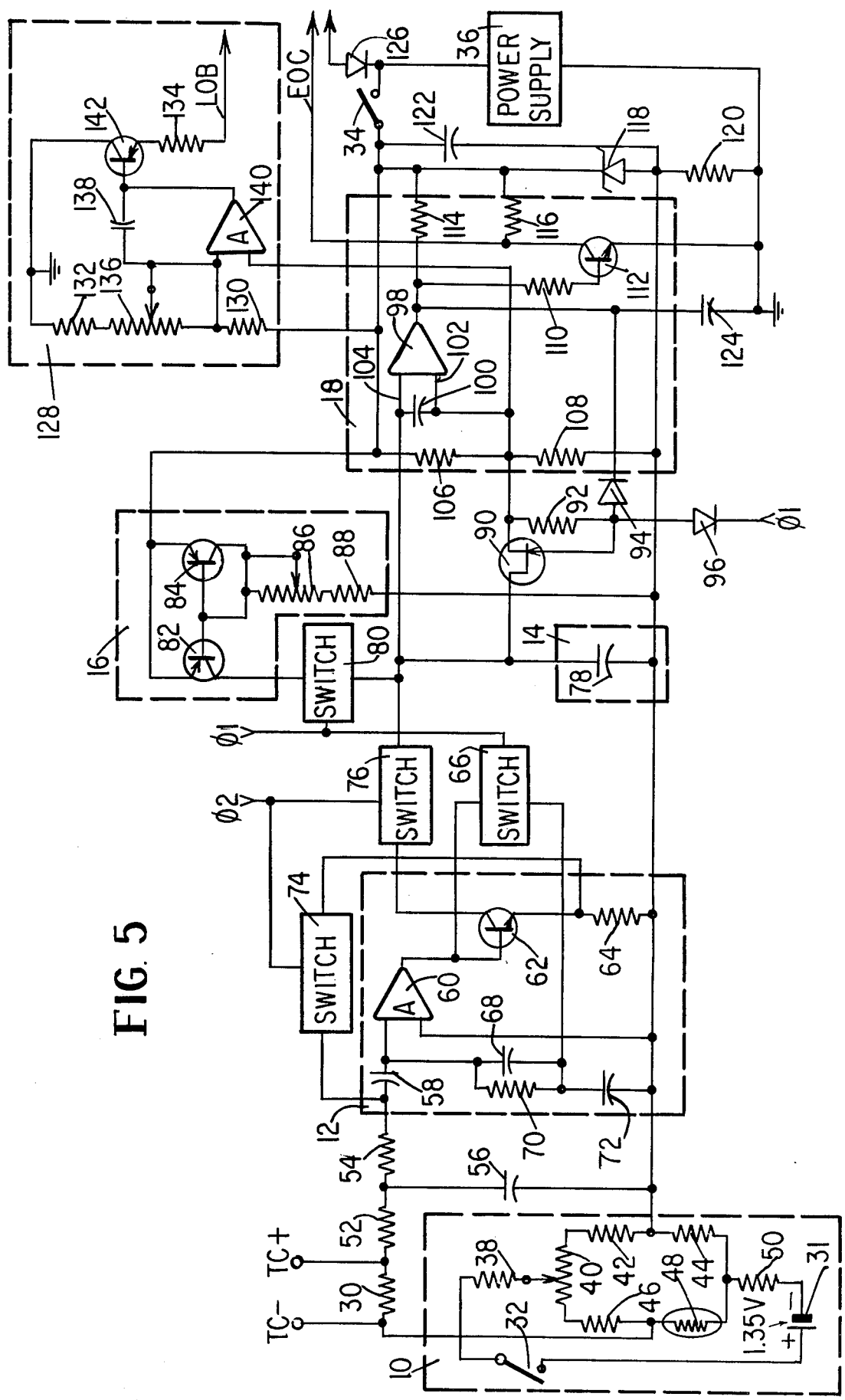
FIG. 5 is a schematic of the analog section of the preferred embodiment of the invention.

FIG. 5 shows the analog section of the apparatus including the thermocouple output shown at TC− and TC+. A resistor 30 is coupled across the thermocouple output to provide a system input impedance. The cold end compensator 10 is coupled to the thermocouple output and includes a battery 31, which can be a +1.35 battery, to provide power to the cold end compensator. The battery is turned on by a manual switch 32 which typically would be ganged with a main power switch 34 which turns on a main power supply 36 to provide power for the rest of the apparatus. With the switch 32 closed, the battery 31 is coupled through a resistor 38 to a potentiometer 40, which forms part of a bridge impedance coupled to TC+ and TC−. The rest of the bridge impedance is formed on one side by a resistor 42 and a resistor 44 and on the other side by a resistor 46 and a temperature sensitive resistor 48. The bridge impedance is coupled back to the battery 31 through a resistor 50. The compensator 10 is calibrated for ambient temperature by shorting the thermocouple output TC− and TC+ and adjusting the potentiometer 40 until the impedance bridge is balanced. The adjustment of the potentiometer 40 compensates for a change in resistance by the temperature sensitive resistor 48 as the ambient temperature changes.

After the input signal or voltage has been compensated, it is coupled through a resistor 52 and a resistor 54 to the voltage to current converter 12. The resistors 52 and 54 along with a capacitor 56 form a single pole RC filter for sixty cycle reduction. The voltage signal $e_1$ is input to a coupling capacitor 58, which couples the voltage to an operational amplifier 60. The amplifier 60 can be, for example, a 741 integrated circuit which can be supplied by Raytheon as an RC741DN. The output of the operational amplifier 60 is input to the base of a transistor 62, which operates as a current source for discharging the integrator 14. The converter 12 changes the small voltage input $e_i$ to the small current output $i_o$ proportional to the voltage $e_i$, and the ratio of the current $i_o$ divided by the voltage $e_i$ or transconductance is determined by the value of a resistor 64 coupled to the emitter of the transistor 62. The output of the amplifier 60 also is coupled through a switch 66 to a junction of a capacitor 68, a resistor 70 and a capacitor 72. When the switch 66 is turned on, it functions to short circuit its inputs and therefore the output of the amplifier 60 is coupled directly back to its input. This can be called the auto-zero time period the purpose of which is to cancel the initial and drift offset characteristics of the amplifier 60. The coupling of the output to the input results in a unity gain in the amplifier 60 and imposes a voltage on the capacitor 72 equal in magnitude, but of opposite polarity to the initial offset voltage of the amplifier. When the switch 66 is turned off, it functions as an open circuit, and the capacitor 72 holds the charge and cancels the initial offset voltage of the amplifier. The capacitor 68 and the resistor 70 provide filtering for the amplifier.

The emitter of the transistor 62 is coupled to and through a switch 74, back to the coupling capacitor 58. The current $i_o$ from the collector of the transistor 62 is coupled to and through a switch 76 to the integrator 14. The integrator 14 is preferably a passive type of integrator including a capacitor 78 acting in conjunction with the switch 76 and a switch 80. The switches 74, 76 and 80 function the same as the switch 66. The constant current source 16 includes a transistor 82 and a transistor 84 with their emitters connected together and through the switch 34 to the power supply 36. The collector of transistor 82 is connected to the switch 80 and the bases of both transistors are connected together to the collector of the transistor 84 which is connected to a potentiometer 86, that is used to set the amount of current produced by the current source, and it is connected to a resistor 88.

The integrator 14 is coupled to a transistor 90 with a resistor 92 being coupled from a base to the emitter. The emitter also is coupled to an AND gate formed by a diode 94 and a diode 96. The components 90, 92, 94 and 96 maintain the fixed reference voltage $V_o$.

The integrator 14 is coupled to the comparator 18 which generates the end of count signal EOC when the reference voltage $V_o$ (FIG. 2) is reached by the charge on the capacitor 78, charging from the current source 16. The comparator 18 includes a comparator 98, which can be, for example, a 311 integrated circuit, which can be supplied by National Semiconductor as an LM311N-8. A compensating capacitor 100 is connected across a first input 102 and a second input 104 of the comparator 98 to prevent the comparator from oscillating. The first input 102 is also connected to the transistor 90, and the second input 104 also is connected to the capacitor 78. A resistor 106 and a resistor 108 from a voltage divider to set the threshold voltage of the comparator 98. The output of the comparator 98 is coupled through a resistor 110 to turn on a transistor 112. The collector output of the transistor 112 is the "end of count" signal EOC. The last two elements of the comparator 18 are a resistor 114 connected between the power supply 36 and the output of the comparator 98 to provide a pull-up or collector load for the comparator 98; and a resistor 116 connected between the power supply 36 and the collector of the transistor 112 to provide a collector load for the transistor. A Zener diode 118 and a resistor 120 coupled between ground and the emitters of the transistors 82 and 84 provide a precision reference for the current source 16. The resistive value of the resistor 120 is chosen to allow the proper amount of current to pass through the diode 118. A capacitor 122 in parallel with the diode 118 provides a bypass for the diode to reduce high frequency fluctuations. A capacitor 124, along with the capacitor 100, provides compensating for the comparator 98 to prevent the comparator from oscillating.

The power supply 36 has been shown as a block for simplicity of illustration and discussion; however, the power supply typically could be two +7.2 volt batteries in series, which would provide outputs of 14.4 volts positive, 7.2 volts positive, and a negative 7.2 volts. The interconnections from the power supply to the circuit elements of the digital section in FIG. 6 have not been connected to the power supply block 36, but they have been noted on FIG. 6. A diode 126 can be utilized to charge the batteries of the power supply 36, from any convenient source as needed.

The apparatus includes a low battery condition indicating circuit 128 to indicate that the output voltages of the power supply 36 have deteriorated to a level where the apparatus can become unreliable and generate erroneous results. The circuit 128 includes resistors 130, 132 and 134, a variable resistor 136, a capacitor 138, an operational amplifier 140 and a transistor 142. The amplifier 149 can be, for example, a 741 integrated circuit the same as the amplifier 60. The resistors 106 and 108 also set the threshold voltage of the amplifier 140. This circuit 128 is coupled to the power supply 36 through the resistor 130, which is connected to one input of the operational amplifier 140. The same input is coupled through the potentiometer 136 and the resistor 132 to ground and, via the capacitor 138, to the base of the transistor 142. The output of the operational amplifier 140 is connected to the base of the transistor 142, its collector being connected to ground and the emitter being connected through resistor 134 to an output line to transmit a signal LOB indicating that a low battery condition has occurred. In calibrating the circuit 128, the potentiometer 136 would be set to just turn on the operational amplifier 140, which would drive the transistor 142 to produce the signal LOB at some predetermined voltage below the normal power supply voltage. When this voltage then occurs in a normal operation of the apparatus at the junction of the resistors 130 and 136, the operational amplifier 140 will be turned on producing the signal LOB. This signal is utilized to drive a portion of the display 28 seen in FIG. 6.

The operation of the analog section especially with regard to the changes caused by the switching implemented by the timing signals $\phi 1$ and $\phi 2$ now will be discussed starting at time $t_o$ utilizing FIGS. 4 and 5. The generation of the signals $\phi 1$ and $\phi 2$ will be discussed later with the operation of the digital section (FIG. 6). At this time the integrator charge level is at the reference voltage $V_o$. The positive signal $\phi 2$ is coupled to switches 74 and 76, turning them on and the low signal $\phi 1$ is coupled to switches 66 and 80 turning them off. The input signal $e_j$ has been stored by the coupling capacitor 58, which will cause the amplifier 60 to amplify a signal proportional to the input signal which is now coupled to the base of the transistor 62. The transistor 62 at this time will generate a current pulse which will discharge the capacitor 78 directly proportional to the input voltage. At the end of this time period, at time $t_1$, the signal $\phi 2$ goes low and the signal $\phi 1$ goes high.

The positive signal $\phi 1$ is coupled to switches 66 and 80, turning them on. The low signal $\phi 2$ is coupled to the switches 74 and 76, turning them off. The switch 66 being on, connects the output of the amplifier 60 to the junction of the capacitors 68 and 72 and the resistor 70 and hence back to the input of the amplifier 60. This is the previously mentioned auto-zero time period of the amplifier 60, producing a unity gain to cancel the initial and drift offset characteristics of the amplifier 60. During the same time period, the switch 80 is on, which causes the current source 16 to charge the integrator 14 at a constant rate (capacitor 78) to the reference voltage $V_o$.

When the charge on the capacitor 78 reaches the voltage $V_o$ at time $t_2$ causes the input 104 to the comparator 98 to exceed its other input 102, causing the comparator 98 to generate a high output signal which is coupled through the resistor 110 to turn on the transistor 112, which produces a negative EOC signal. This signifies the end of the counting period. The charge on capacitor 78 is held at the reference voltage $V_o$ until the start of the next signal $\phi 2$ in the following manner.

The high output signal from the comparator 98 is coupled to the diode 94. At the same time the high signal $\phi 1$ is coupled to the diodes 96, turning on the AND gate formed by the diodes 94 and 96 which turns on the transistor 90. This holds the integrator charge level at the voltage level of the input 102 of the comparator 98. The charging current from the current source 16 now is passing through the transistor 90 which has a small finite resitance causing the charge level of the capacitor 78 and hence the comparator input 104 to be slightly higher than the level of the comparator input 102, insuring that the signal EOC will remain on until the start of the next signal $\phi 2$ at time $t_o'$. When the signal $\phi 2$ goes high, the signal $\phi 1$ goes low causing the input to the diode 96 to go low, which causes the transistor 90 to turn off which allows the integrator 14 to discharge proportional to the next input signal.

Figure 6:
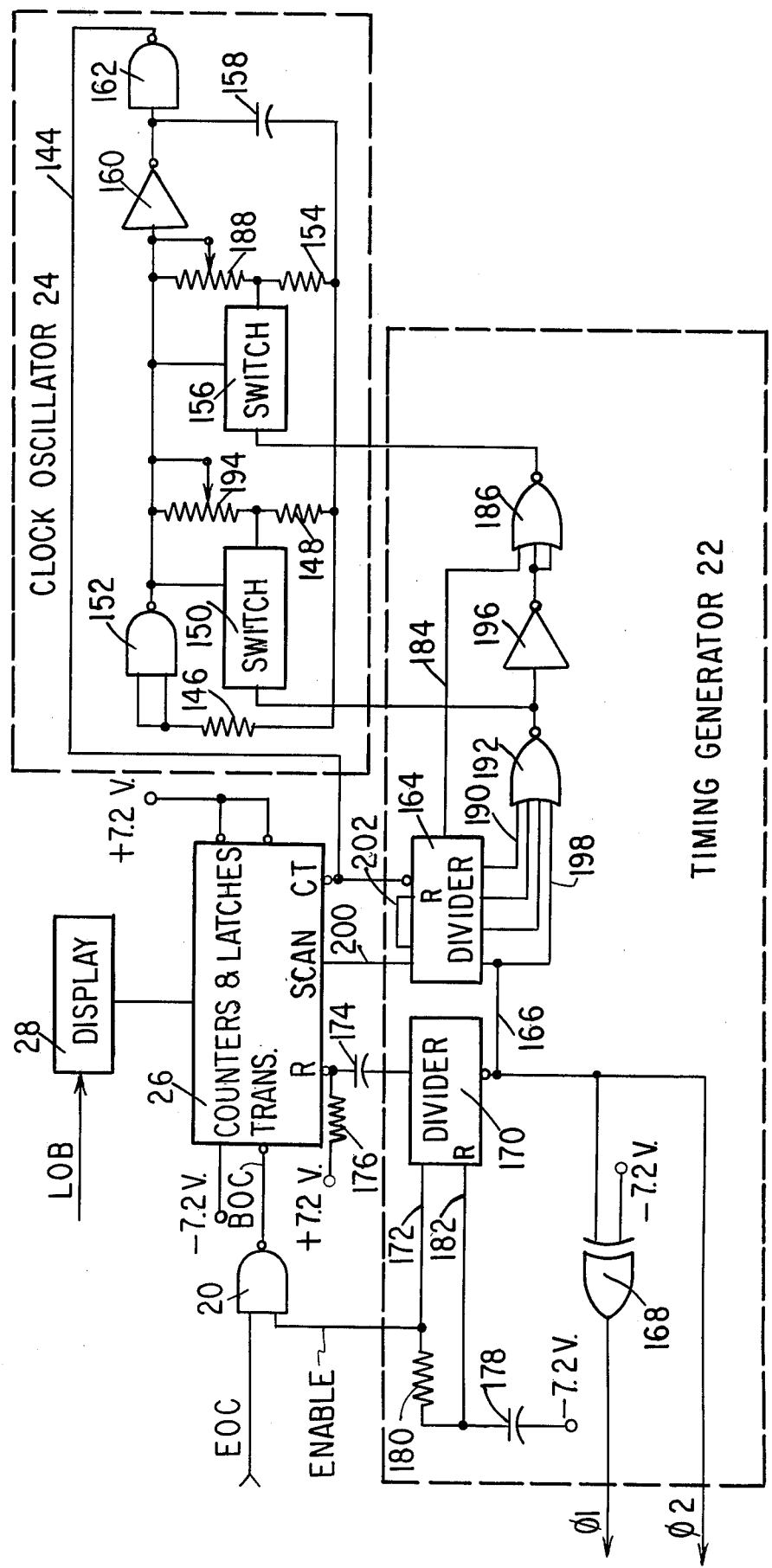
FIG. 6 is a schematic diagram of the digital section of the preferred embodiment of the invention.

Referring now to FIG. 6, the input signals LOB to the display 28 and EOC to the gate 20 can be seen as well as the timing signals $\phi 1$ and $\phi 2$ output from the timing generator 22. The clock circuit 24 is a buffered Schmitt trigger type of oscillator which generates clock pulses at a frequency of two hundred to two hundred and fifty kilohertz on an output line 144. The clock 24 has two sections: a first section includes a resistor 146 and a resistor 148. The resistor 148 is coupled through a switch 150 to the output of a NAND gate 152 which has both of its inputs connected to the resistor 146. The output of the gate 152 also is connected to a second section of the clock 24 including a resistor 154 coupled through a switch 156 to an inverter 160. The output of the inverter 160 is connected to a capacitor 158 and an NAND gate 162. When the switches 150 and 156 are on, they function as a short circuit. The output of the gate 162 is connected to the output line 144 which couples the clock pulses both to the counters in the device 26 and to a divider 164. The device 26 can be, for example, a MK5002-P integrated circuit, supplied by MOSTEK. The divider 146 can be, for example, a 4020 integrated circuit, supplied as a CD4020AE by RCA. The divider 164 is a frequency divider with generates thirty pulses per second on a line 166, which is the origin of the timing signal $\phi 2$, and through an inverter 168 supplies the opposite phase thirty hertz signal $\phi 1$, which are coupled to the switches of FIG. 5 as previously discussed. The thirty hertz signal on the line 166 also is coupled to another frequency divider 170 which produces the ENABLE signal on a line 172 to the gate 20 once every thirty input pulses, i.e. one ENABLE signal per second. The divider 170 can be, for example, a 4024 integrated circuit, supplied as a CD4024AE by RCA. The divider 170 also provides a reset pulse at the beginning of each ENABLE signal to reset the counters in the device 26. The divider produces a low signal coupled to a differential network comprised of a capacitor 174 and a resistor 176. The differential network generates a negative pulse or spike, in response to the low signal, at a reset input of the device 26 which resets the counters for the start of the counting period.

When the divider 170 generates the signal ENABLE on the line 172, a capacitor 178 begins to charge through a resistor 180, and when the capacitor 178 is charged to a sufficient voltage, it will reset the divider 170 via a reset line 182, removing the signal ENABLE from the gate 20. The counters of the device 26 are reset to zero by the reset pulse from the divider 170 and they then will begin counting the pulses received on the line 144 from the clock 24. This count will not be transferred to the latches in the device 26 until the signal BOC is received from the gate 20 at the transfer input of the device 26, at which time the latches will receive the count continuously until the negative signal EOC is coupled to the gate. As shown in FIg. 4, the negative or low signal EOC terminates the low signal BOC when the signal EOC is coupled to the gate 20. When the signal BOC goes high, the count is latched in the device 26 and can be transferred to the display 28, which can by any standard type of display.

The signal EOC is a thirty hertz signal and occurs once during each signal φ1; however, the signal ENABLE is a one hertz signal and occurs only once every thirty of the signals φ1. Therefore, although the counters of the device 26 count during each of the signals φ1, the count is only transferred to the latches in the device 26 on each occurrence of the signal ENABLE, i.e., once per second. Thus the count in the display 28 can be updated once per second.

The linearizing function of the timing generator 22 now will be discussed. The linearization is provided in three steps which provide a first clock frequency during a first count period from zero to two hundred and fifty six, a second lower clock frequency during a second count period from two hundred and fifty-seven through five hundred and twelve and a third lower clock frequency from a count of five hundred and thirteen to the end of range. Other frequencies and break points of course could be chosen, depending upon the signal ranges to be linearized. In this case, during each signal φ1, switches 150 and 156 will be on (short circuited) and the clock will generate clock pulses at a two hundred and fifty kilohertz frequency. After reaching a count of two hundred and fifty-six the divider 164 will generate a signal on a line 184 to an NOR gate 186 which is coupled to the swtich 156 and will turn off the switch (open circuit). When the switch 156 is turned off a new resistance, from a potentiometer 188 is added to the clock circuit 24 because the switch 156 is now open circuited. This decreases the clock frequency from two hundred and fifty to two hundred and thirty kilohertz. After reaching a count of five hundred and twelve the divider 164 will remove the signal on the line 184 and generate a signal on a line 190 to a NOR gate 192 which is coupled to the switch 150 and an inverter 196 coupled to the gate 186. The switch 150 will be turned off by the signal on line 190 and the switch 156 will also be kept turned off by the input to the gate 186 from the inverter 196. When the switch 150 is turned off (open circuit) a second resistance from a potentiometer 194 will be added to the clock circuit 24. This further addition of resistance causes a further decrease in the clock frequency from two hundred and thirty to two hundred kilohertz. The two hundred kilohertz frequency will be maintained until the start of the next signal φ1 by the signal φ2 being coupled to the gate 192 on a line 198. A line 200 is connected from the divider 164 to a scan input of the device 26 to update the display 28. The divider 164 generates pulses on the line 200 to advance the output to the display 28 one digit at a time. The divider 164 also has a line 202 which is used to reset the divider at the beginning of each signal φ1, to turn the swtiches 150 and 156 back on which changes the clock frequency back to two hundred and fifty kilohertz.

The amount of modulation in the clock frequency, and hence the amount of linearization applied to the obtained count, is attained by adjusting the potentiometers 188 and 174. These potentiometers are adjusted for a particular thermocouple alloy and temperature range to produce the desired linearization.

The component values for the apparatus when utilizing a standard "H" type thermocouple are listed in Table 1.

TABLE 1*

| Component | Value or Type | Component | Value or Type |
|---|---|---|---|
| 30 | 61.9 | 106 | 806 |
| 38 | 1.5K | 108 | 2K |
| 40 | 10 | 110 | 47K |
| 42 | 100 | 114 | 4.7K |
| 44 | 100 | 116 | 47K |
| 46 | 100 | 118 | 1N821A |
| 48 | 100 | 120 | 1.5K |
| 50 | 1.5K | 122 | .47uf |
| 52 | 100K | 124 | 1000pf |
| 54 | 100K | 126 | 1N914 |
| 56 | .15uf | 130 | 806 |
| 58 | 1uf | 132 | 4.99K |
| 64 | 806 | 134 | 1K |
| 68 | .01uf | 136 | 2K |
| 70 | 499K | 138 | .15uf |
| 72 | .47uf | 146 | 15K |
| 78 | 1uf | 148 | 7.5K |
| 86 | 5K | 154 | 7.5K |
| 88 | 14K(C° scale) or 24.9K(F° scale) | 156 | 270pf |
| | | 174 | 4700pf |
| 92 | 22 Meg | 176 | 20K |
| 94 | 1N914 | 178 | .15uf |
| 96 | 1N914 | 180 | 100K |
| 100 | 1000pf | 188 | 5K |
| | | 194 | 5K |

*All resistances in ohms
uf = micro farad
pf = pico farad

Many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of linearizing the output signals produced by an analog measuring instrument including the steps of:
    converting each of said output signals into a time referenced signal;
    generating clock pulses of a first frequency; counting said clock pulses;
    changing said first frequency to a second frequency at least at a first predetermined count; and
    obtaining the number of clock pulses generated during the duration of said time referenced signal.

2. A method of linearizing according to claim 1 further including the step of:
    synchronizing selected ones of said time referenced signals with said counting.

3. A method of linearizing according to claim 1 further including the steps of:
    obtaining said number of clock pulses only after a predetermined number of said time referenced signals; and
    displaying said obtained number of clock pulses.

4. A digitized linearizing correction apparatus for linearizing the output signals of an analog measuring instrument comprising:
    conversion means for converting each of said output signals into a time referenced signal;
    clock pulse generating means for generating clock pulses of a first frequency;
    counter means for counting said clock pulses;
    frequency modulating means for changing said clock pulse generating frequency to at least a second frequency at least at a first predetermined count of said clock pulses; and
    means for obtaining the number of clock pulses generated during said time referenced signal.

5. An apparatus according to claim 4 wherein said frequency modulating means further include:

timing generator means for synchronizing said counter means with selected ones of said time referenced signals.

6. An apparatus according to claim 4 in which said obtaining means include:
latch means for latching said obtained number of clock pulses in response to the end of said time referenced signal; and
display means for displaying said latched number of clock pulses.

7. An apparatus according to claim 4 wherein said frequency modulating means further include:
first reset signal means for resetting said counter means; and
enable signal means for enabling said obtaining means only after a predetermined number of said time referenced signals.

8. An apparatus according to claim 4 wherein said frequency modulating means include:
at least a first impedance means coupled to said clock pulse generating means; and
switch means interposed between said impedance means and said clock pulse generating means to change the impedance of said impedance means at least at said first predetermined count of said clock pulses to effect said frequency change.

9. An apparatus according to claim 4 wherein said conversion means include:
first current source means for generating a current signal proportional to each of said output signals;
second current source means providing a constant current signal of opposite polarity to said proportional signal;
integrating means coupled alternately to said first and second current source means for integrating said current signals and generating an output;
reference means for generating a reference signal; and
comparison means coupled to said integrating and said reference means for comparing said integrating output to said reference signal for designating the end of said time referenced signals.

10. An apparatus according to claim 9 wherein said frequency modulating means further include:
timing generator means for synchronizing said couner means with said time referenced signals, including first and second timing signai means for alternately coupling said integrating means respectively to said first and second current source means.

11. An apparatus according to claim 9 wherein said frequency modulating means further include:
first reset signal means for resetting said counter means when said integrating means is coupled to said second current source means; and
enable signal means for enabling said obtaining means only after a predetermined number of said time referenced signals.

12. An apparatus according to claim 11 further including:
latch means for latching said obtained number of clock pulses in response to the end of a predetermined number of said time referenced signals; and
display means for displaying said latched number of clock pulses.

* * * * *

UNITED STATES PATENT AND TRADEMARK OFFICE
CERTIFICATE OF CORRECTION

PATENT NO. : 4,045,658
DATED : August 30, 1977
INVENTOR(S) : VEIKKO K. PELTOLA AND JAMES M. DUROS It is certified that error appears in the above-identified patent and that said Letters Patent are hereby corrected as shown below:

```
In column 1, line 26, change "posses" to --possess--;
In column 1, line 28, change "a" to --is;
In column 3, line 63, change "t2" to --t3--;
In column 4, line 1, change "change" to --charge--;
In column 6, line 65, change "149" to --140--;
In column 7, line 30, change "ej" to --ei--;
In column 7, line 62, change "diodes" to --diode--;
In column 8, line 65, change "FIg" to --FIG--;
In column 9, line 2, change "by" to --be--;
In column 12, line 14, change "couner" to --counter--.
```

Signed and Sealed this

Twentieth Day of December 1977

[SEAL]

Attest:

RUTH C. MASON
Attesting Officer

LUTRELLE F. PARKER
Acting Commissioner of Patents and Trademarks